(12) United States Patent
Goel et al.

(10) Patent No.: US 10,861,534 B2
(45) Date of Patent: Dec. 8, 2020

(54) MEMORY CELL WRITE ASSIST IN RESPONSE TO VOLTAGE TRACKING OF A REPLICA CIRCUIT

(71) Applicant: Arm Limited, Cambridge (GB)

(72) Inventors: Ankur Goel, Noida (IN); Ishan Khera, Ferozepur (IN); Nimish Sharma, Jalandhar (IN); Ishita Satishchandra Desai, Surat (IN); Vikash Kumar, Noida (IN); Nitesh Gautam, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/368,246

(22) Filed: Mar. 28, 2019

(65) Prior Publication Data

US 2020/0312403 A1    Oct. 1, 2020

(51) Int. Cl.
| G11C 11/00 | (2006.01) |
| G11C 11/419 | (2006.01) |
| G11C 11/412 | (2006.01) |
| H01L 27/11 | (2006.01) |
| G11C 11/413 | (2006.01) |

(52) U.S. Cl.
CPC .......... *G11C 11/419* (2013.01); *G11C 11/412* (2013.01); *G11C 11/413* (2013.01); *H01L 27/11* (2013.01); *H01L 27/1104* (2013.01)

(58) Field of Classification Search
CPC ... G11C 11/412; G11C 11/413; G11C 11/419; H01L 27/11; H01L 27/1104
See application file for complete search history.

(56) References Cited

U.S. PATENT DOCUMENTS

| 8,325,512 | B2 * | 12/2012 | Chuang | G11C 11/413 365/154 |
| 8,665,658 | B2 * | 3/2014 | Chen | G11C 7/227 365/189.14 |
| 8,958,237 | B1 * | 2/2015 | Yang | G11C 11/419 365/154 |
| 10,515,697 | B1 * | 12/2019 | Jain | G11C 7/062 |
| 2015/0262655 | A1 | 9/2015 | Hsieh et al. | |

* cited by examiner

*Primary Examiner* — Pho M Luu
(74) *Attorney, Agent, or Firm* — Pramudji Law Group PLLC; Ari Pramudji

(57) ABSTRACT

The claimed subject matter relate to circuits and/or methods, which operate to introduce a variable delay in a write-assist signal to a write driver of an array of SRAM cells. Particularly, a variable delay may be introduced by way of a voltage tracking circuit, which may generate a trigger signal in response to a voltage signal from an array of access devices that replicate access devices of the array of SRAM cells.

20 Claims, 3 Drawing Sheets

MEMORY CELL WRITE ASSIST IN RESPONSE TO VOLTAGE TRACKING OF A REPLICA CIRCUIT

TECHNICAL FIELD

This disclosure relates to circuits and methods for providing signals to assist in performing write operations to memory cells.

BACKGROUND

In computing devices, which may include devices such as general-purpose hand-held computers, gaming devices, communications devices, smart phones, embedded or special-purpose computing systems, an array of memory cells may be utilized to store instructions, for example, for use by one or more processors of the computing device. Such computing devices may utilize various memory technologies, such as static random-access memory (SRAM) arrays, to store instructions executable by a processor and/or to store any results of such execution. In such memory arrays, a binary logic value of "1" or a binary logic value of "0," may be determined at a bit line of a cell of a SRAM in response to a voltage being applied to the gate of one or more access transistors of the cell of the SRAM array.

However, when utilizing SRAM arrays, such as during write operations, it may be advantageous to perform the write operations, such as to a bit cell of the SRAM array, when a signal present at an access device of the bit cell meets a specified criteria. In some instances, such specified criteria may relate to a level of a voltage signal present at a gate of the access device. In certain instances, when a signal present at an access device exceeds, for example, a lower threshold, attempting a memory writing operation, such as writing of a logic "0" or a logic "1," may give rise to memory write errors. However, detection and correction of such a memory write errors may bring about noticeable delays in processing operations or may give rise to other undesirable consequences. In some instances, such processing delays may represent a source of frustration to users of such computing devices. Thus, it may thus be appreciated that providing memory write signals comprising levels within specified ranges, which may assist in expediting computer processing operations, continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Figure 1A:
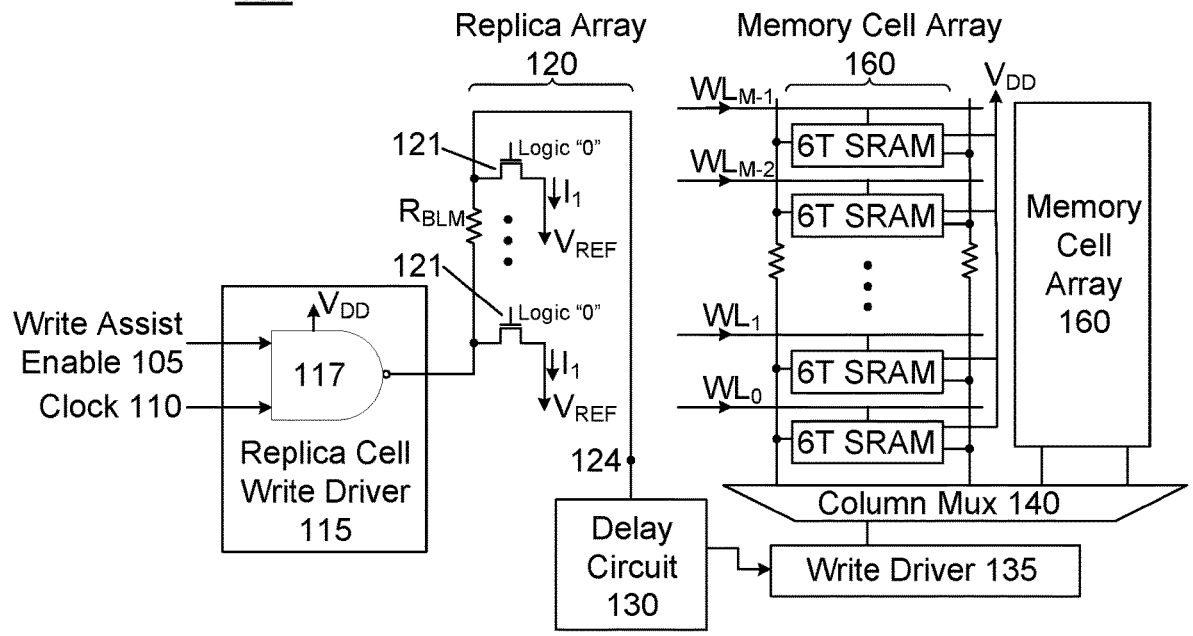
FIG. 1A is a diagram of a replica array of access devices utilized in a perform memory write operation according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously mentioned, in a computing device, which may include a device such as a general-purpose hand-held computer, a gaming device, a communications device, a smart phone, an embedded or special-purpose computing system, an array of memory cells, such as a SRAM array, may be utilized to store instructions for use by one or more processors of the computing device. In such memory arrays, storage of a binary digit within a memory cell, such as a binary digit representing a logic value of "1" or a logic value of "0," may be brought about via application of an appropriate signal to an access device of the memory cell. For example, storage of a binary logic value within a cell of a SRAM array may be achieved via applying a signal comprising a relatively low level, such as a signal that approaches a reference voltage, to an access device of a memory cell of the SRAM array. Application of the relatively low level signal to the access device of the memory cell, in combination with application of a relatively high level signal at a word line coupled to the memory cell, may bring about current conduction through one or more switching devices (e.g., transistors) of the memory cell. In response to the conduction of current, a logic state of the one or more switching devices of the memory cell may transition from a binary logic value of, for example, "1" to a second binary logic value of, for example, "0."

However, under certain conditions, it may be difficult to determine precise timing parameters related to when a signal voltage at an access device may be expected to fall below a threshold level, such as a voltage level. In particular instances, such timing parameters may be influenced by a variety of factors, such as ambient temperature of memory cells of a SRAM array. For SRAM arrays operating at, for example, −40.0° C., a voltage signal present at an access device may approach a threshold value at a first rate of decrease measured, for example, in volts/nanosecond. However, at a second operating temperature such as, for example, +125.0° C., a voltage signal present at an access device may approach a threshold value at a second rate of decrease, which may be substantially dissimilar to the first rate of decrease. Further, for SRAM arrays comprising complementary-metal-oxide-semiconductor (CMOS) a rate of decrease of a voltage signal of an N-type metal-oxide-semiconductor (NMOS) may differ significantly from a rate of decrease of a voltage signal of a P-type metal-oxide-semiconductor (PMOS). Such changes in rates of decrease of a signal from PMOS versus NMOS devices may at least partially depend on process corners that characterize PMOS and NMOS transistor devices involved in generating signals to be applied to memory access devices. Such process corners may include slow NMOS/fast PMOS (SF) and fast NMOS/ fast PMOS (FF) corners. Other process corners, which may refer to carrier mobilities may include slow NMOS/slow PMOS (SS), fast NMOS/slow PMOS (FS) and typical/ typical (TT) process corners.

Accordingly, in particular embodiments, a write-assist signal may be generated, which may operate to provide precise triggering of a write signal to be coupled to an access device of a SRAM cell. Thus, in certain embodiments, a write operation involving a SRAM cell may be initiated following a voltage signal falling below a threshold level, which may increase reliability of a write operation to the SRAM cell. In certain embodiments, such precise triggering of a write signal for coupling to an access device may operate over a wide ambient temperature range, such as a range of about −40.0° C. to about +125° C., for example. Further, accuracy in the triggering of a write signal for use by a memory access device may be maintained over a variety of process corners, such as SF, FF, SS, FS and process corners. Such control over the triggering of write signals utilized by memory access devices may reduce an occurrence of memory write errors, which may thus decrease time consumed performing memory write operations. Such decreases may, in turn, bring about an observable increase in the speed of operation of a computing device.

Before discussing various embodiments in reference to the accompanying figures, a brief description of various nonlimiting embodiments is provided in the following paragraphs. For example, a particular embodiment may be directed to a circuit that includes an input node to obtain a signal from a replica circuit of a memory cell. The circuit may additionally include an output node to provide a write-assist signal to the memory cell, wherein the write-assist signal is generated in response to the circuit tracking the signal obtained from the replica circuit of the memory cell approaching a control voltage applied to the memory cell. In one embodiment, the memory cell may correspond to a bit cell, and the control voltage may operate to select the bit cell for a memory write operation. In one embodiment, the memory cell may include a static random-access (SRAM) memory cell. In one embodiment, the circuit may generate a write-assist signal in response to the signal from the replica circuit corresponding to a voltage that is within about 15.0% of the control voltage over an operating range of about −40.0° C. to about +125.0° C. In one embodiment, the control voltage may correspond to a reference voltage.

In one embodiment, the above-identified circuit may operate exclusive of a delay circuit. The above-identified circuit may include an arrangement of switching devices in which a first switching device of the arrangement of switching devices transitions in response to the signal at the input node falling below a threshold value. The first switching device of the arrangement of switching devices may include an area greater than an area of another switching device of the arrangement of switching devices.

In one embodiment, an apparatus may include a replica circuit corresponding to a memory cell. The apparatus may additionally include a half-Schmitt trigger to obtain a signal from the replica circuit and to generate an output signal in response to the signal from the replica circuit having a value within a predetermined margin of a control signal. In one embodiment, the control signal may correspond to a reference voltage. Additionally, the control signal may operate to bring about a change of state of the memory cell. In an embodiment, the output signal generated by the half-Schmitt trigger may initiate a writing operation to the memory cell. In one embodiment, the predetermined margin of the control signal may be dependent upon the ratio of the area of a first switching device of the half-Schmitt trigger to the area of a second switching device of the half-Schmitt trigger. In an embodiment, the memory cell may correspond to a cell of a SRAM. In an embodiment, the circuit may include an arrangement of switching devices, wherein a first switching device of the arrangement of switching devices transitions in response to an output node of the replica circuit falling below a threshold level.

In one embodiment, a method of generating a write-assist signal to a memory cell may include obtaining a signal from a replica circuit, wherein the replica circuit corresponds to a memory cell. The method may additionally include generating the write-assist signal to communicate with the memory cell in response to a tracking circuit detecting that the obtained signal level is approaching a control voltage applied to the memory cell. In one embodiment, the write-assist signal may be generated in response to the tracking circuit tracking the signal obtained from the replica circuit attaining a magnitude that is within about 15.0% of the control voltage. In an embodiment, the control voltage applied to the memory cell may correspond to a reference voltage. In an embodiment, the tracking circuit may include a half-Schmitt trigger, which may operate to transition from a first output signal state to a second output signal state over an operating temperature range of about −40.0° C. to about +125.0° C.

Particular embodiments will now be described with reference to the figures, such as FIG. 1, which is a block diagram 100 of a replica array of access devices utilized to assist in performing a memory write operation according to an embodiment. In the embodiment of FIG. 1A, to initiate a memory write operation, replica cell write driver 115 may receive input signals comprising write-assist enable signal 105 and clock signal 110. Replica cell write driver 115 may operate to provide a signal to write driver 135, which may provide an estimate of when actual write operations involving column multiplexer 140 and memory cell array 160 should be initiated. Thus, in the embodiment of FIG. 1A, operations conducted by write driver 135, such as selection of a word line $WL_{M-1}$, $WL_{M-2}$, ..., $WL_1$, or $WL_2$, may be triggered at a time at which circuit elements (e.g., access devices) of individual six-transistor SRAM cells of memory cell array 160 may permit memory write operations to be reliably performed.

In particular embodiments, memory write-assist operations of replica cell write driver 115 may be performed in response to receiving write-assist enable signal 105, which may comprise an active low signal. Thus, during a low portion of the cycle of clock signal 110, write-assist enable signal 105 and clock signal 110 may cooperate to provide relatively low-level signals to the input nodes of NAND logic element 117. In the embodiment of FIG. 1A, in response to write-assist enable signal 105 and clock signal 110 comprising relatively low levels at the input nodes of NAND logic element 117, an output node of logic element 117 may transition to a relatively high level, such as a level that approaches a supply voltage ($V_{DD}$) of replica cell write driver 115.

The relatively high-level signal from replica cell write driver 115 may be conducted through resistor $R_{BLM}$, which may comprise a resistance similar, or at least comparable to, metallic conductors of an actual memory cell array, such as memory cell array 160 of FIG. 1A. The relatively high-level signal from replica cell write driver 115 may be applied to a terminal of a three-terminal switching device, such as drain regions of NMOS transistors 121 of replica array 120, which may resemble access devices of a corresponding number of six-transistor SRAM cells. It should be noted that although replica array 120 depicts only two NMOS transistor access devices, claimed subject matter is intended to embrace any number of access devices of SRAM cells. Thus, replica array 120 may comprise 8 transistors, 16 transistors, 32 transistors, 64 transistors, or any other number of transistors, virtually without limitation. Additionally, while access devices of replica array 120 are described as comprising NMOS transistors, claimed subject matter is intended to embrace utilization of various transistors and/or switching devices, such as PMOS transistors, junction field-effect transistors (JFETs), bipolar junction transistors (BJTs), and so forth.

Following application of the relatively high-level signal from replica cell write driver 115 to terminals of NMOS transistors 121, a signal corresponding to a binary logic value of "0" may be applied to gate regions of NMOS transistors 121. In the embodiment of FIG. 1A, a binary logic value of "0" may correspond to a voltage level that initiates current discharge through of NMOS transistors 121 of replica array 120, such as by way of providing current conduction ($I_1$) through NMOS transistors 121. Accordingly, in particular embodiments, over a duration, such as a duration of approximately 1.0 ns to 10.0 ns, a voltage level at output node 124 of replica array 120 may approach a reference voltage ($V_{REF}$). In certain embodiments, a voltage level at output node 124 of replica array 120 may approach a reference voltage ($V_{REF}$) within a somewhat narrower time window, such as between 4.0 ns and 6.0 ns, although claimed subject matter is not limited in this regard.

Accordingly, it may be appreciated that it may be problematic to determine precisely when to trigger a memory write operation involving memory cell array 160 utilizing, for example, write driver 135 and column multiplexer 140. In some instances, a voltage level at output node 124 may approach a reference voltage ($V_{REF}$) within, for example, between 1.0 and 10.0 ns. However, in the absence of such greater precision in the tracking of memory write operations, particular embodiments may implement delay circuit 130, which may operate to ensure that memory write driver 135 does not prematurely trigger write operations of memory cells of memory cell array 160. Such early triggering of write operations may result in memory write errors, such as those in which, for example, a cross-coupled inverter of six-transistor SRAM cells of fails to transition from a binary logic value of "1" to a binary logic value of "0." In particular embodiments, memory write operations attempted while a voltage signal at an access device of a memory cell comprises greater than 5.0% or 10.0% of a supply voltage (e.g., $V_{DD}$) may give rise to unacceptably high memory write errors. Accordingly, in an effort to avoid unacceptably high memory write errors, circuit 130 may operate to delay memory write operations by, for example, up to 10.0 ns or more.

Therefore, it may be appreciated that the use of delay circuit 130, which may introduce a constant delay in the triggering of memory write operations conducted by write driver 135, may give rise to delays in memory write operations. In addition, while an introduction of a delay in a memory write operation may be appropriate in some instances, in other instances, such delays may be unwarranted. For example, for access transistors operating at a SS process corner (with respect to carrier mobilities) at 125.0° C., an introduction of a delay of approximately 10.0 ns, for example, may be appropriate to allow a voltage signal at an access device to fall to a level of 5.0% to 10.0% of a supply voltage. However, for access transistors operating at other process corners, such as a FF process corner (with respect to carrier mobilities) at −40.0° C., an introduction of a delay of approximately 10.0 ns, for example, may unnecessarily delay memory write operations. Such unnecessary delays may give rise to unnecessarily slow processing operations conducted by a processor coupled to a memory cell array 160.

Figure 1B:
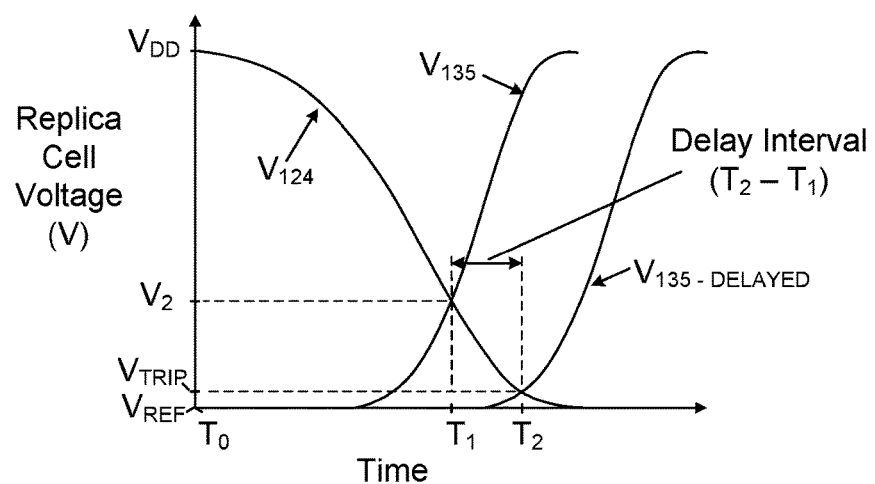
FIG. 1B shows a graph of amplitude of an output signal of a memory replica cell as a function of time according to an embodiment.

To illustrate introduction of a delay in the initiation of memory write operations by a write driver, FIG. 1B shows a graph of amplitude of an output signal, as a function of time, of a signal from a memory replica cell according to an embodiment 175. The circuit of FIG. 1A may be suitable for generating the signals of FIG. 1B, although alternative circuitry may generate the signals of FIG. 1B, and claimed subject matter is not limited in this respect. In accordance with the description of FIG. 1A, it may be desirable for signal $V_{124}$ from an access device of a memory cell to discharge from a relatively high level, such as $V_{DD}$, to a relatively low level, such as $V_{TRIP}$, prior to triggering a memory write operation. Thus, as depicted in FIG. 1B, over a duration of $T_0$ to $T_1$, signal $V_{124}$, measured at output node 124, may decrease from $V_{DD}$ to $V_2$. However, also as depicted in FIG. 1B, signal level $V_2$ may significantly exceed a desired signal level, such as $V_{TRIP}$. Accordingly, if write driver 135 were to initiate a memory write operation involving a six-transistor SRAM cell of memory cell array 160, such as by generating output signal $V_{135}$ comprising an amplitude $V_2$ at time $T_1$, such initiation of the memory write operation may give rise to an increased likelihood of memory write errors. Such memory write errors may include failure of a cross-coupled inverter of a six-transistor SRAM cell of memory cell array 160 to transition, for example, from a binary logic value of "1" to a binary logic value of "0." It should be noted that such premature output signal generation from write driver 135 may bring about other types of memory write errors, and claimed subject matter is not limited in this respect.

Accordingly, to reduce a likelihood of an introduction of memory write errors by SRAM cells of a memory cell array, delay circuit 130 of FIG. 1A may introduce a delay interval in the triggering of memory write operations. Referring to the graph of FIG. 1B, such a delay interval may comprise a duration of an amount $T_2-T_1$. In one embodiment, introduction of such a delay may permit a signal level applied at an access device of a six-transistor SRAM cell to decrease to a value that at approximates $V_{TRIP}$, such as depicted by delayed signal $V_{135\text{-}DELAYED}$ in FIG. 1B. In one embodiment, such a delay interval (e.g., $T_2-T_1$) may comprise a constant value of approximately 10.0 ns, although claimed subject matter is not limited to any particular delay. It should also be noted that the delay interval $T_2-T_1$ may remain constant over a range of ambient operating temperatures, such as temperatures ranging from −40.0° C. to +125.0° C. Accordingly, under particular transistor operating conditions (e.g., transistor ambient temperature, transistor process corner, etc.) that may bring about a relatively rapid decrease in a voltage level at output node 124, a delay interval corresponding to interval $T_2-T_1$ may unnecessarily delay downstream operations, such as operations conducted by write driver 135. Such unnecessary delays in downstream operations may introduce delays in overall computing device operating speed.

Figure 2:
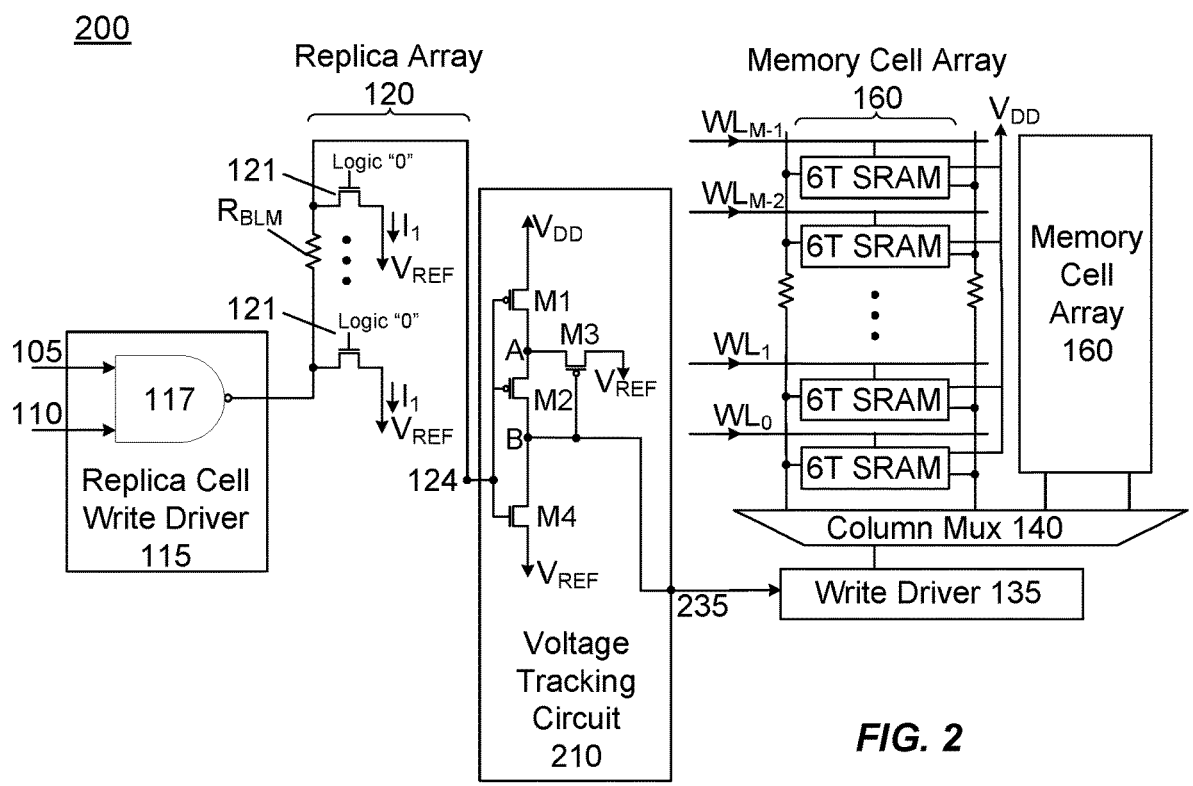
FIG. 2 is a diagram of a replica array of access devices and a tracking circuit according to an embodiment.

FIG. 2 is a diagram of a replica array of access devices coupled to a signal tracking circuit according to an embodiment 200. In the circuit of FIG. 2, in a manner similar to that of FIG. 1A, replica cell write driver 115 may obtain input signals such as write-assist enable signal 105 and clock signal 110. During a low portion of the cycle of clock signal 110, signals 105 and 110 may cooperate to provide relatively low-level signals to the input nodes of NAND logic element 117. Following the presence of low-level signal inputs at NAND logic element 117, an output node of logic element 117 may transition to a relatively high level, such as a level that approaches a supply voltage ($V_{DD}$) of replica cell write driver 115. The relatively high signal from replica cell write driver 115 may be conducted through resistor $R_{BLM}$ for coupling to terminals of three-terminal switching devices, such as drain regions of NMOS transistors 121 of replica array 120. In a manner similar to that of FIG. 1A, a signal corresponding to a binary logic value of "0" may be applied to gate regions of NMOS transistors 121 to initiate current discharge of NMOS transistors 121 of replica array 120, such as by way of providing current conduction ($I_1$) through NMOS transistors 121.

However, in a departure from the circuit of FIG. 1A, voltage tracking circuit 210 may operate to introduce a variable delay signal to write driver 135, rather than the fixed or constant delay introduced by delay circuit 130. In the embodiment of FIG. 2, voltage tracking circuit 210 may operate to trigger memory writing operations that depend upon a signal level at output node 124 of replica array 120 falling below a threshold signal level. In the embodiment of FIG. 2, voltage tracking circuit 210 may operate exclusive of a fixed delay circuit, such as delay circuit 130 of FIG. 1. For example, when a voltage signal at output signal node 124 approaches a lower threshold value, such as a threshold value that approaches a reference voltage, switching device M4 may immediately transition from a current-conducting state (e.g., an "on" state) to a high-impedance state (e.g. an "off" state). In response to an interruption in current conduction through switching device M4, a signal level at node B of voltage tracking circuit 210 may immediately transition from comprising a relatively low voltage to an increased voltage. After node B transitions to an increased voltage, a gate portion of switching device M3 may operate to permit current flow from node A to a reference node ($V_{REF}$). In addition, and also in response to output signal node 124 approaching a lower threshold value, switching devices M2 and M1, which may comprise PMOS transistors, may transition from a high-impedance state to a current-conducting state, thereby allowing switching device M1 to supply current to switching device M3.

It may be appreciated that voltage tracking circuit 210 may be similar in construction and operation to a half-Schmitt trigger, so as to generate an output signal that transitions from a relatively low level, such as a level that approaches a reference voltage, to a relatively high level, such as a voltage that approaches $V_{DD}$, in response to the magnitude of a signal present at node 124. Accordingly, voltage tracking circuit 210 operates to generate a triggering signal at node 235 for coupling to write driver 135 immediately following the signal present at node 124 falling below a threshold value. Thus, when one or more of transistors 121 of replica array 120 and of memory cell array 160 discharge at a relatively fast rate, which may occur when such transistors operate in accordance with a FF process corner, write driver 135 may be triggered following a relatively short delay interval introduced by voltage tracking circuit 210. Conversely, when one or more of transistors 121 of replica array 120 and of memory cell array 160 discharge at a relatively slow rate, in accordance with a SS process corner, write driver 135 may be triggered following a relatively longer delay interval introduced by voltage tracking circuit 210. Thus, it may be appreciated that voltage tracking circuit 210 may provide a variable delay interval that is dependent upon discharge rates of constituent transistor devices of replica array 120. In addition, as discharge rates of transistors of replica array 120 and memory cell array 160 respond to changes in ambient operating temperature, such as within temperature ranges from −40.0° C. to +125.0° C., a delay interval introduced by voltage tracking circuit 210 may be adjusted without a need for external control. Accordingly, in contrast to the fixed or constant delay interval introduced by delay circuit 130 described in relation to FIG. 1A, voltage tracking circuit may introduce a vanishingly small delay interval, at least in particular instances.

In particular embodiments, an output signal from voltage tracking circuit 210 may transition from generating a relatively low-level signal to a relatively high-level signal in response to a signal present at node 124 decreasing to comprise a value of within about 5.0% of a reference voltage ($V_{REF}$). However, by way of controlling relative area of one or more of switching devices M1-M4, switching of output signals from voltage tracking circuit 210 may transition in response to a signal present at node 124 decreasing to comprise other values in relation to a reference voltage ($V_{REF}$). In certain embodiments, a ratio in the area of switching devices M3 relative to M1 (e.g., the area of M3 greater than the area of M1) of voltage tracking circuit 210 may be particularly influential in determining a transition from generating a relatively low-level signal to generating a relatively high-level signal-level signal. It should be noted, however, that other area relationships between switching devices M1-M4 may affect low-level-to-high-level output signal transitions, and claimed subject matter is not limited in this respect.

Figure 3:
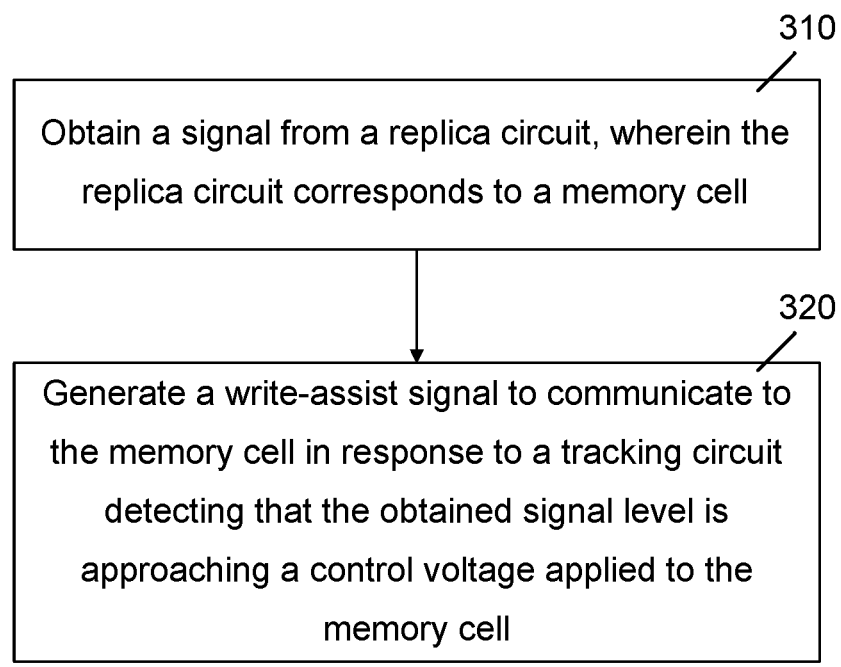
FIG. 3 is a flow chart for a method of generating a write-assist signal to a memory cell according to an embodiment.

FIG. 3 is a flow chart for a method 300 of generating a write-assist signal to a memory cell according to an embodiment. FIG. 3 may include blocks in addition to those shown and described, fewer blocks, or blocks occurring in an order different than may be identified, or any combination thereof. Additionally, although the circuit of FIG. 2 may perform the method 300, claimed subject matter is intended to embrace other circuits, apparatuses, and/or systems, virtually without limitation. The method of FIG. 3 may begin at block 310, which may comprise obtaining a signal from a replica circuit, wherein the replica circuit corresponds to a memory cell. A signal from a replica circuit may represent a voltage signal applied to an access device of memory cell, such as a six-transistor SRAM cell, which may decrease in magnitude in response to the application of a signal to a gate region of one or more transistors of the replica circuit. The signal from the replica circuit may be conveyed to a voltage tracking circuit, such as voltage tracking circuit 210 of FIG. 2.

The method may proceed to block 320, which may comprise generating a write-assist signal to communicate to a memory cell in response to the tracking circuit detecting that the obtained signal level is approaching a control voltage applied to the memory cell. In an embodiment, the voltage tracking circuit may comprise a half-Schmitt trigger, which operates to generate an output signal which transitions from a relatively low state to a relatively high state in response to an output signal voltage of a replica circuit approaching a control voltage. In particular embodiments, a control voltage may correspond to a reference voltage, which may operate to permit a memory write operation of a six-transistor SRAM cell of a memory cell array. However, in certain embodiments, a control voltage may correspond to a voltage other than a reference voltage, and claimed subject matter is not limited in this respect. In one embodiment, the voltage tracking circuit may generate an output signal that transitions from a relatively low level to a relatively high level in response to the signal from the replica circuit approaching a value that is within about 5.0% of a reference voltage. It should be noted, however, that claimed subject matter is intended to embrace a voltage tracking circuit to generate an output signal that transitions at other values with respect to a reference voltage, such as values less than 5.0% of a reference voltage, such as 1.0% of a reference voltage, 2.5%, a reference voltage, and so forth. Claimed subject matter is also intended to embrace a voltage tracking circuit to generate an output that transitions at values greater than 5.0% of a reference voltage, such as 7.5% of a reference voltage, 10% of a reference voltage, and so forth, virtually without limitation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit, comprising:
    an input node to obtain a signal from a replica circuit of an access device of a memory cell; and
    an output node to provide a write-assist signal to the memory cell, wherein
    the write-assist signal is generated in response to the circuit tracking the signal obtained from the replica circuit of the memory cell approaching a control voltage applied to the memory cell, wherein the circuit operates exclusive of a delay circuit.

2. The circuit of claim 1, wherein the memory cell comprises a bit cell, and wherein the control voltage operates to select the bit cell for a memory write operation.

3. The circuit of claim 1, wherein the memory cell comprises a static random-access memory cell.

4. The circuit of claim 1, wherein the circuit generates the write-assist signal in response to the signal from the replica circuit comprising a voltage that is within about 15.0% of the control voltage over an operating temperature range of about −40.0° C. to about +125.0° C.

5. A circuit, comprising:
    an input node to obtain a signal from a replica circuit of an access device of a memory cell; and
    an output node to provide a write-assist signal to the memory cell, wherein
    the write-assist signal is generated in response to the circuit tracking the signal obtained from the replica circuit of the memory cell approaching a control voltage applied to the memory cell, wherein the control voltage corresponds to a reference voltage.

6. The circuit of claim 5, wherein the circuit comprises an arrangement of switching devices, and wherein a first switching device of the arrangement of switching devices is configured to transition in response to the signal at the input node falling below a threshold value.

7. The circuit of claim 5, wherein the memory cell comprises a static random-access memory cell.

8. The circuit of claim 5, wherein the memory cell comprises a bit cell, and wherein the control voltage operates to select the bit cell for a memory write operation.

9. A circuit, comprising:
    an input node to obtain a signal from a replica circuit of an access device of a memory cell; and
    an output node to provide a write-assist signal to the memory cell, wherein
    the write-assist signal is generated in response to the circuit tracking the signal obtained from the replica circuit of the memory cell approaching a control voltage applied to the memory cell, wherein the circuit comprises an arrangement of switching devices, and wherein a first switching device of the arrangement of switching devices is configured to transition in response to the signal at the input node falling below a threshold value.

10. The circuit of claim 9, wherein the first switching device comprises an area greater than an area of another switching device of the arrangement of switching devices.

11. An apparatus, comprising:
    a replica circuit corresponding to a memory cell; and
    a half-Schmitt trigger to obtain a signal from the replica circuit and to generate an output signal in response to the signal from the replica circuit having a value within a predetermined margin of a control signal, wherein the control signal corresponds to a reference voltage.

12. The apparatus of claim 11, wherein the control signal operates to bring about a change of state of the memory cell.

13. The apparatus of claim 11, wherein the output signal generated by the half-Schmitt trigger initiates a writing operation to the memory cell.

14. The apparatus of claim 11, wherein the predetermined margin of the control signal is dependent upon the ratio of the area of a first switching device of the half-Schmitt trigger to the area of a second switching device of the half-Schmitt trigger.

15. The apparatus of claim 11, wherein the memory cell corresponds to a static random-access memory (SRAM) cell.

16. An apparatus, comprising:
    a replica circuit corresponding to a memory cell; and
    a half-Schmitt trigger to obtain a signal from the replica circuit and to generate an output signal in response to the signal from the replica circuit having a value within a predetermined margin of a control signal, wherein the circuit comprises an arrangement of switching devices, and wherein a first switching device of the arrangement of switching devices is configured to transition in response to an output node of the replica circuit falling below a threshold level.

17. A method of generating a write-assist signal to a memory cell, comprising:
    obtaining a signal from a replica circuit, the replica circuit corresponding to the memory cell; and
    generating the write-assist signal to communicate to the memory cell in response to a tracking circuit detecting that the level of the obtained signal is approaching a control voltage applied to the memory cell, wherein the write-assist signal is generated in response to the tracking circuit tracking the signal obtained from the replica circuit attaining a magnitude that is within 15.0% of the control voltage over an operating temperature range of about −40.0° C. to about +125.0° C.

18. The method of claim 17, wherein the memory cell comprises a cell of an SRAM array.

19. A method of generating a write-assist signal to a memory cell, comprising:
   obtaining a signal from a replica circuit, the replica circuit corresponding to the memory cell; and
   generating the write-assist signal to communicate to the memory cell in response to a tracking circuit detecting that the level of the obtained signal is approaching a control voltage applied to the memory cell, wherein the control voltage applied to the memory cell corresponds to a reference voltage to initiate a writing operation to the memory cell.

20. A method of generating a write-assist signal to a memory cell, comprising:
   obtaining a signal from a replica circuit, the replica circuit corresponding to the memory cell; and
   generating the write-assist signal to communicate to the memory cell in response to a tracking circuit detecting that the level of the obtained signal is approaching a control voltage applied to the memory cell, wherein the tracking circuit comprises a half-Schmitt trigger to transition from a first output signal state to a second output signal state.

* * * * *